United States Patent [19]

Tsutsui et al.

[11] Patent Number: 5,835,030
[45] Date of Patent: Nov. 10, 1998

[54] SIGNAL ENCODING METHOD AND APPARATUS USING SELECTED PREDETERMINED CODE TABLES

[75] Inventors: Kyoya Tsutsui, Kanagawa; Mito Sonohara, Tokyo; Osamu Shimoyoshi, Kanagawa, all of Japan

[73] Assignee: Sony Corporation, Tokyo, Japan

[21] Appl. No.: 535,217

[22] PCT Filed: Apr. 3, 1995

[86] PCT No.: PCT/JP95/00644

§ 371 Date: Jan. 26, 1996

§ 102(e) Date: Jan. 26, 1996

[87] PCT Pub. No.: WO95/27336

PCT Pub. Date: Oct. 12, 1995

[30] Foreign Application Priority Data

Apr. 1, 1994 [JP] Japan ................................ 6-065343

[51] Int. Cl.⁶ .......................... H03M 7/03; G11B 20/10
[52] U.S. Cl. .............................. 341/51; 341/106
[58] Field of Search ........................ 341/106, 67, 58, 341/59, 68, 51

[56] References Cited

U.S. PATENT DOCUMENTS

| | | | |
|---|---|---|---|
| 4,485,337 | 11/1984 | Sandusky ............................. | 318/314 |
| 4,669,120 | 5/1987 | Ono ....................................... | 381/40 |
| 4,908,810 | 3/1990 | Oie ........................................ | 369/50 |
| 4,972,484 | 11/1990 | Theile .................................. | 381/37 |
| 5,040,217 | 8/1991 | Brandenburg ....................... | 381/47 |
| 5,045,812 | 9/1991 | Tateishi ................................ | 331/10 |
| 5,063,550 | 11/1991 | Watari et al. ..................... | 369/44.36 |
| 5,109,417 | 4/1992 | Fielder ................................. | 381/36 |
| 5,204,677 | 4/1993 | Akagiri et al. ..................... | 341/118 |
| 5,223,926 | 6/1993 | Stone et al. .. | |
| 5,301,205 | 4/1994 | Tsutsui et al. ..................... | 375/1 |
| 5,311,561 | 5/1994 | Akagiri ................................ | 375/122 |
| 5,365,530 | 11/1994 | Yoshida ............................... | 371/37.4 |
| 5,440,404 | 8/1995 | Okamoto ............................. | 358/432 |

FOREIGN PATENT DOCUMENTS

| | | | |
|---|---|---|---|
| 39 33974 A1 | 4/1990 | Germany ..................... | B11B 19/274 |
| 3-72722 | 3/1991 | Japan .......................... | H03M 7/30 |
| 4-343577 | 11/1992 | Japan .......................... | H04N 1/41 |
| 2 252 002 | 7/1992 | United Kingdom .......... | H04N 7/133 |

OTHER PUBLICATIONS

T. Mochizuki et al., "Constraint Conditions for Multiple–Blocksize Modified–DCT," Technical Research Report of the Institute of Electronics and Communication Engineers of Japan, CAS90–10, DSP 90–14, pp. 55–60.

F. Hazu et al., "Adaptive Block Length Adaptive Transform Coding Using MDCT (ATC–ABS)," Society of Electronics and Information Communication Engineers of Japan, Spring National Meeting Lecture Collection of 1990, A–197.

*Primary Examiner*—Marc S. Hoff
*Assistant Examiner*—Peguy JeanPierre
*Attorney, Agent, or Firm*—Limbach & Limbach, LLP

[57] ABSTRACT

An apparatus for encoding data includes adaptive bit allocation encoding circuitry that normalizes frames of input spectrum data into transform frames in accordance with normalization coefficients and number of quantization step information. Quantized data encoding circuitry encodes each transform frame of normalized spectrum data with at least one selected code table of a plurality of code tables in accordance with a code table selection signal. Code train generation circuitry generates a code train that includes the encoded normalized spectrum data and information indicative of the at least one selected code table and of the normalization coefficients and number of quantization step information in accordance with which the encoding circuitry normalizes each frame of input spectrum data. Control circuitry generates the code table selection signal, the number of quantization step information, and the normalization coefficients in response to the input spectrum data.

19 Claims, 12 Drawing Sheets

SIGNAL ENCODING METHOD AND APPARATUS USING SELECTED PREDETERMINED CODE TABLES

DESCRIPTION

1. Technical Field

This invention relates to signal encoding and decoding and, in particular, to encoding and decoding efficiently and to achieve a desired bit rate.

2. Background Art

Transform encoding using "spectrum transform processing" is known. Spectrum transform processing is an efficient encoding for carrying out bit compression of time series sample data signals (such as digital audio signals, etc.) with high efficiency.

Specifically, Spectrum transform processing includes dividing an input signal into blocks, to implement spectrum transform processing in respective block units. Discrete Cosine Transform (DCT) processing is the representative spectrum transform processing of the transform encoding.

In such a transform encoding, there is a problem with block distortion such that discontinuous connecting (joining) portions between blocks are perceived as noise. In order to lessen such a block distortion, a method of allowing end portions of a block to overlap with adjacent blocks is generally carried out.

That is, MDCT (Modified DCT or Improved DCT) is such that double transmission with respect to samples at overlapping portions is not carried out. An arbitrary block is allowed to overlap with blocks adjoining in both directions thereof respectively by halves (half blocks). The arbitrary block is therefore suitable for efficient encoding.

Encoding and decoding using such MDCT (and IMDCT, which is the inverse transform processing thereof) is disclosed in, e.g., Mochizuki, Yano, Nishitani "Filter Constraints of Plural Block Size MDCT", Technical Research Report of Institute of Electronics and Communication Engineers of Japan, CAS90-10, DSP 90-14, pp. 55–60, and Hazu, Sugiyama, Iwatare, Nishitani "Adaptive Block Length Adaptive Transform Coding using MDCT (ATC-ABS)", Society of Electronics and Information Communication Engineers of Japan Spring National Meeting Lecture Collection of 1990, A-197.

The processing procedure using MDCT and IMDCT discussed above will be briefly described below with reference to FIG. 12. In FIG. 12, an arbitrary block of time series sample data, e.g., the J-th block has a 50% portion overlapping with the (J−1)-th block and a 50% portion overlapping with the (J+1)-th block. When the number of samples of the J-th block is assumed to be N (N is natural number), the J-th block has overlap of N/2 samples between the J-th block and the (J−1)-th block, and also has overlap of N/2 samples between the J-th block and the (J+1)-th block. Pre-processing filter window Wh is applied to these respective blocks, e.g., an arbitrary J-th block input time series sample dO1 to obtain N time series data dO2.

A characteristic of the pre-processing filter transform window Wh, is selected in correspondence with the statistical property of an input signal such that the degree of power concentration of transform data is maximum. By implementing linear transform processing of MDCT an the time series data dO2 of N samples, N/2 (number of), which is one half of the number of input samples, independent spectrum data dO3 indicating levels of spectrum components are obtained on the frequency base. By implementing processing of linear inverse transform of IMDCT to the N/2 (number of) spectrum data dO3, N (number of) time series data dO4 are obtained. Synthesis filter (window Wf for inverse transform) is applied to the time series data dO4 to obtain time series data dO5, which is thereafter added to output results of blocks before and after to restore (reconstruct) original input time series sample data.

In the conventional efficient encoding, there has been adopted a method of dividing spectrum data dO3 obtained in a manner as described above into several units, every band, to carry out normalization. Quantization is conducted by taking the characteristic from a viewpoint of the hearing sense into consideration to carry out recording or transmission along with normalization coefficients of respective units.

In addition, as in the ISO11172-3 of the ISO standard, entropy encoding is implemented such that short and long codes are respectively allocated to data of higher frequency and data of lower frequency, respectively. Thus, efficiency is increased.

However, where entropy encoding is implemented in this way, the numbers of bits after encoding are different for every block of inputted time series sample data. In these circumstances, the number of bits that results may be greater than the number of bits in the state before entropy encoding is implemented.

In addition, there is the drawback that, in order to implement entropy encoding, the hardware required is increased. In this case, there are uses where there is a need to improve encoding efficiency even if the hardware scale becomes large; and uses where there is a need to reduce the hardware scale although it is not required to have the encoding efficiency to be so high. These are contradictory requirements.

DISCLOSURE OF THE INVENTION

An apparatus in accordance with the inveniton is for encoding data includes adaptive bit allocation encoding circuitry that normalizes frames of input spectrum data into transform frames in accordance with normalization coefficients and number of quantization step information. Quantized data encoding circuitry encodes each transform frame of normalized spectrum data with at least one selected code table of a plurality of code tables in accordance with a code table selection signal. Code train generation circuitry generates a code train that includes the encoded normalized spectrum data and information indicative of the at least one selected code table and of the normalization coefficients and number of quantization step information in accordance with which the encoding circuitry normalizes each frame of input spectrum data. Control circuitry generates the code table selection signal, the number of quantization step information, and the normalization coefficients in response to the input spectrum data.

The invention also an encoding method, a complementary decoding apparatus and method, and a recording medium having data recorded thereon that has been encoded using, for example, the encoding method.

BEST MODE FOR CARRYING OUT THE INVENTION

Preferred embodiments of this invention will now be described with reference to the attached drawings.

Figure 1:
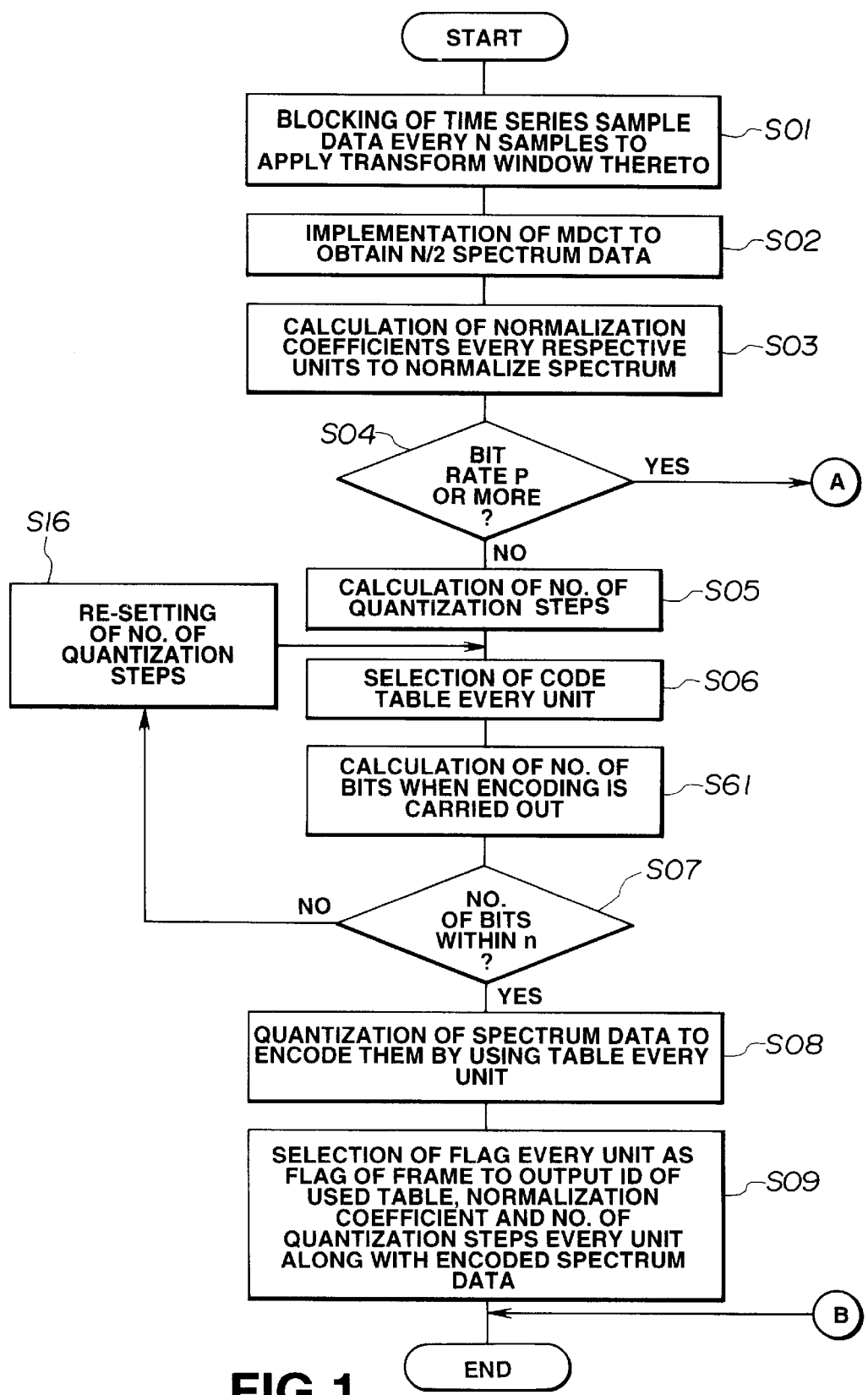
FIG. 1 is a flowchart showing outline of a portion of the operation of the fundamental embodiment of a signal encoding method according to this invention.
Figure 2:
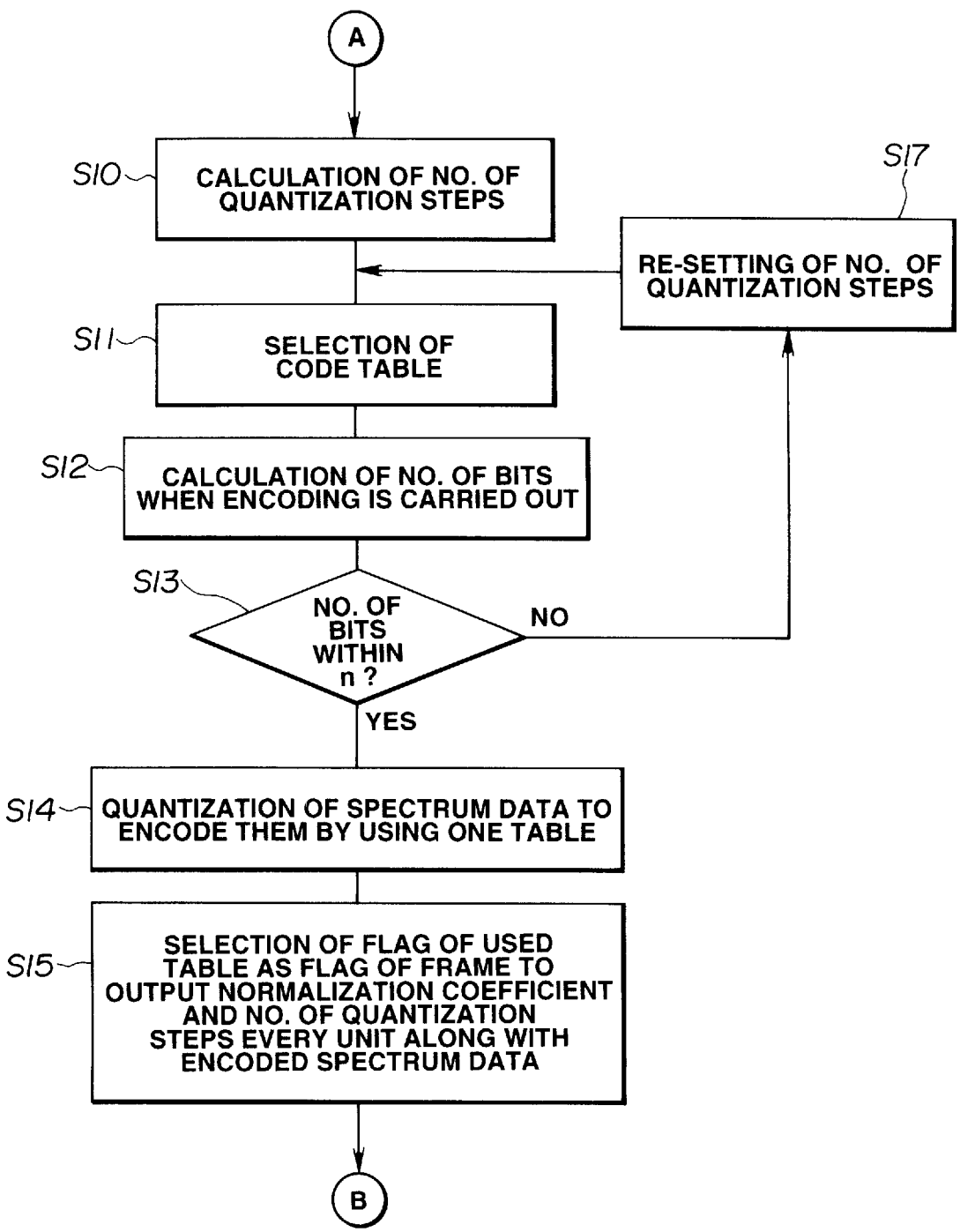
FIG. 2 is a flowchart showing outline of the other portion of the operation of the fundamental embodiment of the signal encoding method according to this invention.

FIGS. 1 and 2 are a flowchart showing an outline of the procedure of encoding processing using an embodiment according to this invention.

Figure 12:
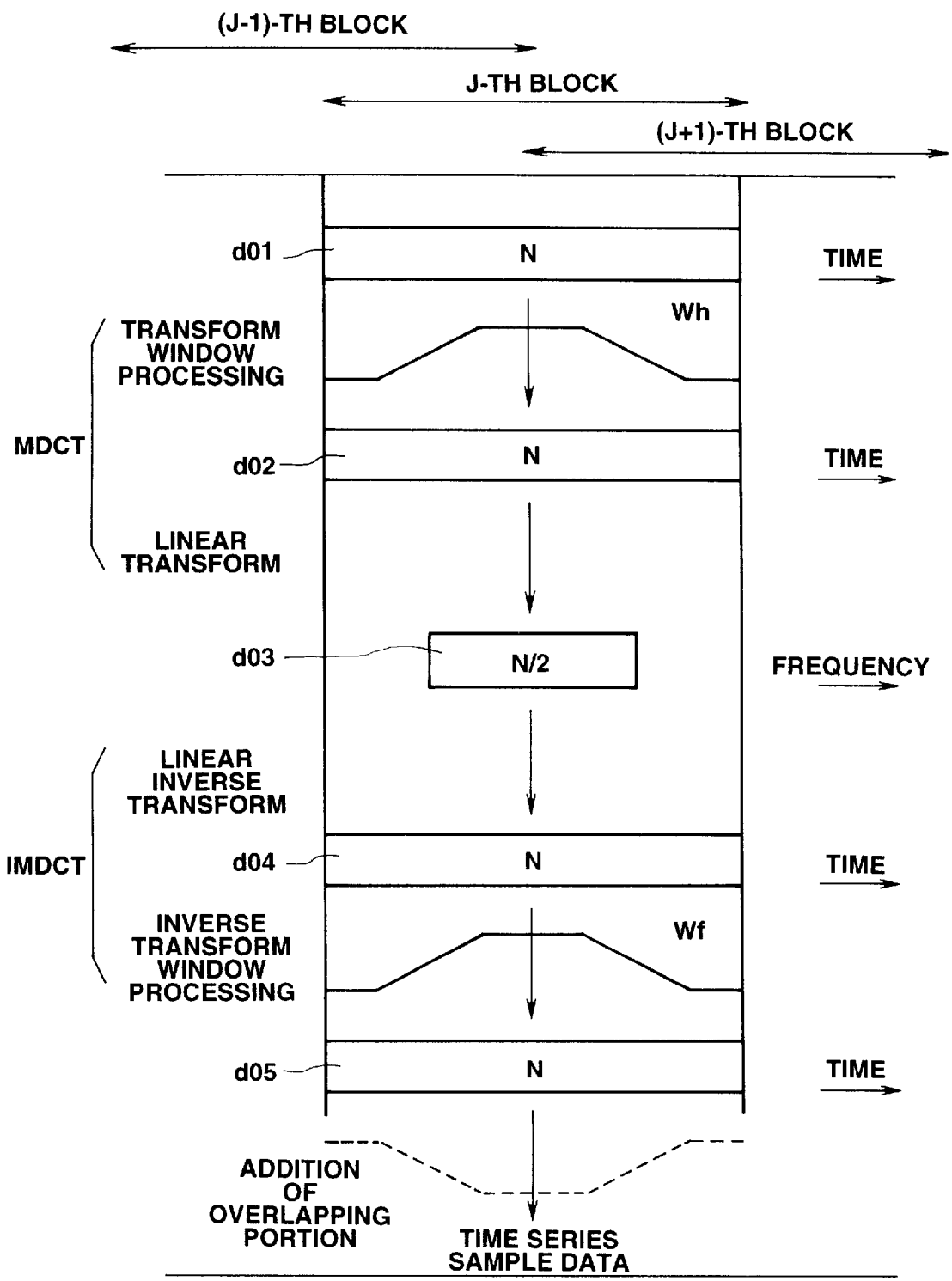
FIG. 12 is a view for explaining outline of the processing procedure of MDCT (Modified Discrete Cosine Transform) and IMDCT which is the inverse transform processing thereof.

Initially, at the first step S01 shown in FIG. 1, time series sample data, e.g., PCM audio data, etc. is divided into blocks every predetermined number of samples (N samples in this example). As shown in the FIG. 12 mentioned above, respective blocks are set so that overlapping quantity between blocks adjacent to each other becomes equal to 50%, i.e., so that they overlap with each other by N2 samples. A transform window Wh as shown in FIG. 12 is applied to sample data of the j-th block of the time series data. At the step S02, MDCT is implemented thereto, thus to obtain N/2 (number of) spectrum data indicating levels of spectrum components.

At step S03, normalization coefficients are calculated. Normalization is implemented to the spectrum data, e.g., with respect to a plurality of units obtained by dividing spectrum data in a form similar to so called critical bands.

At step S04, judgment is made as to whether the bit rate of encoded data transfer, (i.e., transfer bit rate of medium or transmission path) is greater than or equal to a preset number p. When the transfer bit rate is p or more, the processing operation proceeds to step S10 shown in FIG. 2. When the transfer bit rate is smaller than p, the processing operation proceeds to step S05 of FIG. 1.

At step S05 and step S10, the numbers of quantization steps required for each unit are respectively calculated, taking into account the hearing sense. Thus, the processing operation proceeds either to the subsequent step S06 or step S11 of FIG. 2.

At step S06 of FIG. 1, an optimum code table is selected for each unit. The optimum code table referred to here may be, e.g., a code table having the highest encoding efficiency, or may be a suitable code table determined by carrying out simplified calculation in the case there is a limitation in hardware.

At step S61, the number of bits required in the case where encoding is carried out by using the code table selected at the step S06 is calculated. Thus, the processing operation proceeds to step S07.

At step S07, judgment is made as to whether the number of bits calculated at step S61 is within n, adapted to satisfy the predetermined bit rate p. In the case where the number of bits is greater than n, the number of quantization steps is reset at step S16. Thus, the processing operation returns to step S06 for a second time. In contrast, if the number of bits is within n at the step S07, the processing operation proceeds to step S08.

At step S08, spectrum data is quantized by the current number of quantization steps thereafter to carry out encoding by using the code table set at the step S06 for each unit. Thus, the processing operation proceeds to step S09.

At step S09, a flag is selected indicating the identification (ID) signal of the code table set at step S06 is independently subjected to transmission or recording every each unit as flag of code table of this frame. Also at step S06, the selected ID signal normalization coefficient and the number of quantization steps every each unit along with the spectrum data encoded at the step S08 are output. Thus, the processing is completed.

In step S11 shown in FIG. 2, (in the case where, at step S04, the bit rate is greater than or equal to p) one code table used in this frame is selected. At step S12, this selected code table is used to calculate the number of bits used in the case where encoding is carried out.

At step S13, it is determined whether the number of bits calculated at step S12 is within "n". If the number of bits is greater than n, the number of quantization steps is reset at step S17. Thus, the processing operation returns to the step S11 for a second time. In contrast, if it is judged at step S13 that the number of bits is within n, the processing operation proceeds to step S14.

At step S14, the spectrum data is quantified by the current number of quantization steps using one code table set at the step S11.

At step S15, a flag is selected to indicate the ID of the code table set at step 11 for this frame. At step S15, the selected flag, the normalization coefficient and the number of quantization steps per unit are output along with the spectrum data encoded at the step S14. Thus, the processing is completed.

The particulars of the code table are now discussed. A code table of Huffman code (which is a sort of entropy code) may be used. Thus, a plurality of tables of Huffman code may be provided to carry out the above-mentioned processing, or values themselves after having undergone quantization may be used as code table values. Namely, plural tables provided may have any code, with the type of code not being limited to entropy code. It should be noted that while using values themselves, after having undergone quantization as code table value is substantially equal to not using code table processing at all. This is called "encoding" using a code table in this embodiment.

While this embodiment is described such that only one code table is selected with respect to one frame when the bit rate is a predetermined value or more, there are various other possibilities. For example, a user may select a code table in advance. There is no limitation in particular as to the relationship between the case where only one code table is selected with respect to one frame and the case of switching between a plurality of code tables to use a selected one.

Here, an actual example of code table used in encoding every respective frame and a flag designating the applicability thereof, is shown in the following Table 1.

TABLE 1

| FLAG | CODE TABLE | APPLICABILITY |
| --- | --- | --- |
| 00 | CT0 | ENTIRETY OF FRAME |
| 01 | CT1 | ENTIRETY OF FRAME |
| 10 | CT2 | ENTIRETY OF FRAME |
| 11 | | EVERY RESPECTIVE UNITS (RESPECTIVE NOS. OF QUANTIZATION STEPS) |

Referring to Table 1, in the case where flag is "00", it is indicated that all spectrum data a frame are encoded by code table CT0. Similarly, also in the case of flags "01", "10", it is indicated that all spectrum data in a frame are respectively encoded by code tables CT1 and CT2. Moreover, for example, in the case where flag is "11", it is indicated that spectrum data in frame are encoded by different code tables every respective units. It is sufficient to carry out, at a different predetermined position (location) within the same frame, transmission or recording of information indicating a relationship between respective units and code tables by which those units are encoded.

Further, while it is indicated in this embodiment that switching between code tables is made every respective units, it is conceivable, in addition to switching every respective units, to carry out switching between plural code tables, e.g., every respective numbers of quantization steps. In such a case, as a matter of course, signals (code table sub-information) controlled by flag and subjected to transmission or recording at a different position (location) are signals every respective numbers of quantization steps.

Practically, this is equivalent to a method of allowing code table selected when the number of quantization steps is, e.g., 2 bits and code table selected when the number of quantization steps is, e.g., 3 bits to be different from each other. Because numbers of quantization steps are allocated-every respective units, it is sufficient to switch between code tables in response to the numbers of quantization steps every respective units to use the code table obtained by switching to implement encoding thereto.

Moreover, switching between code tables may be carried out every block constituted with plural blocks. It is to be noted that in the case where switching between code tables is carried out every unit, every block or every number of quantization steps, these units being a unit smaller than the frame in a manner as described above, an approach is employed to transmit flag "00", "01", or "10" shown in the Table 1 as code table sub information every switching unit of code table to indicate by the transmitted flag which code table is selected for every unit, every block or every number of quantization steps.

A more practical example of an efficient encoding apparatus for realizing the above-described encoding processing will now be described with reference to FIG. 3.

Figure 3:
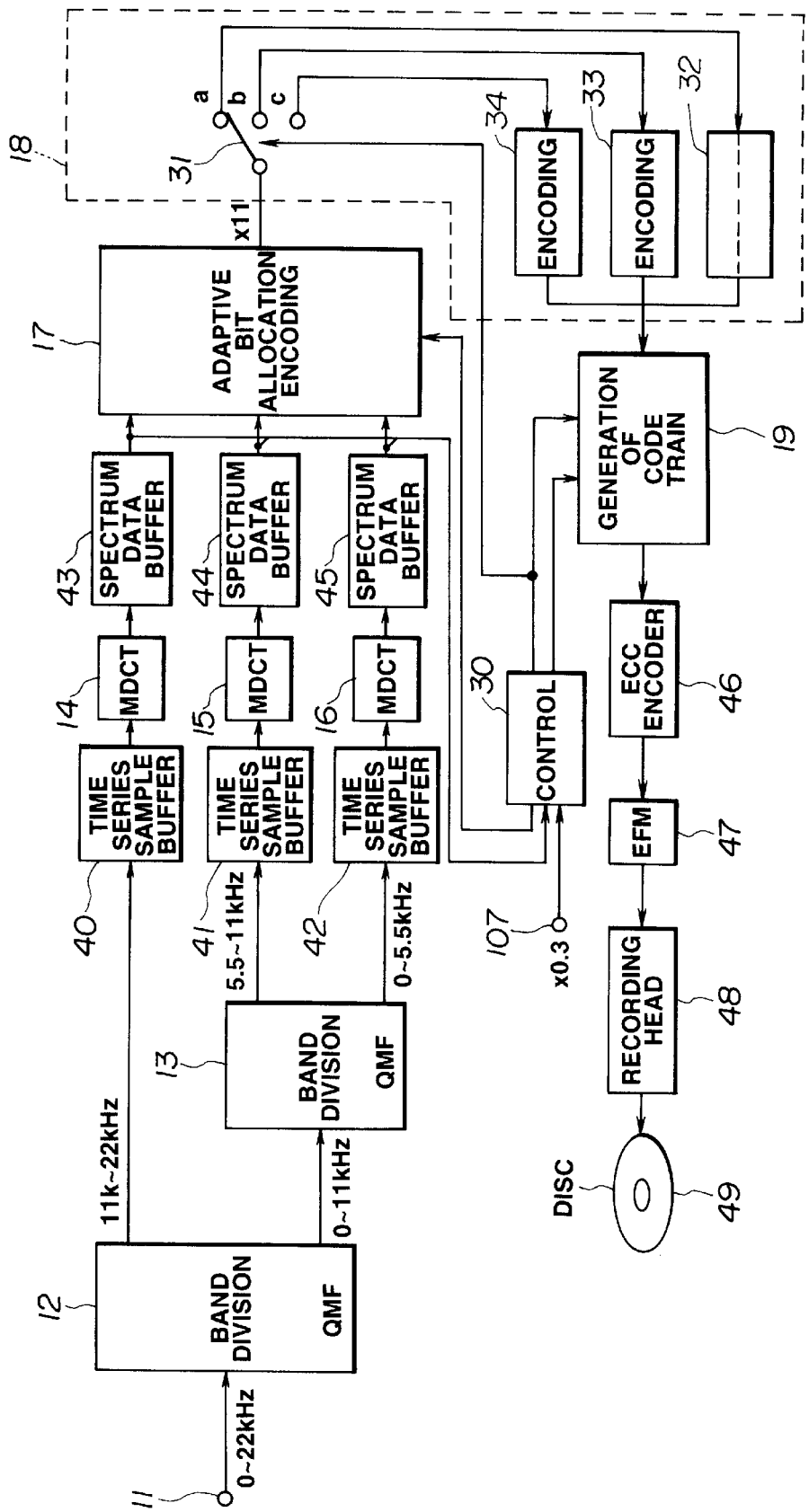
FIG. 3 is a block diagram showing an example of a circuit configuration of an efficient encoding apparatus which realizes the signal encoding method of the embodiment.

The more practical efficient encoding apparatus shown in FIG. 3 uses respective technologies of Sub Band Coding (Band Division Encoding), Adaptive Transform Encoding and Adaptive Bit Allocation. Namely, an approach is employed to divide an inputted digital signal such as PCM audio signal, etc. into signal components in a plurality of frequency bands, and to make a selection such that, as frequency shifts to higher frequency band side, bandwidths become broader to carry out the above-mentioned MDCT, which is the orthogonal transform processing, every respective frequency bands to adaptively bit-allocate the spectrum data on the frequency base thus obtained every units set by taking so called critical bands into consideration to encode those data.

In FIG. 3, input terminal 11 is supplied with, e.g., an audio PCM signal of 0~22 kHz. This input signal is divided into a signal in 0~11 kHz band and a signal in 11 k~22 kHz band by a band division filter 12 (e.g., QMF filter). The signal in the 0~11 kHz band is divided into a signal in a 0~5.5 kHz band and a signal in a 5.5. k~11 kHz band similarly by a band division filter 13. The signal in the 11 k~22 kHz band from the band division filter 12 is temporarily stored into a time series sample buffer 40, and is then sent to a circuit 14 for carrying out MDCT (Modified Discrete Cosine Transform) as described above (which is an example of an orthogonal transform circuit). The signal in the 5.5. k~11 kHz band from the band division filter 13 is temporarily stored into a time series sample buffer 41, and is then sent to a MDCT circuit 15. The signal in the 0 to 5.5 kHz band from the band division filter 13 is temporarily stored into a time series sample buffer 42, and is then sent to a MDCT circuit 16. Thus, these signals are respectively subjected to MDCT processing.

Figure 6:
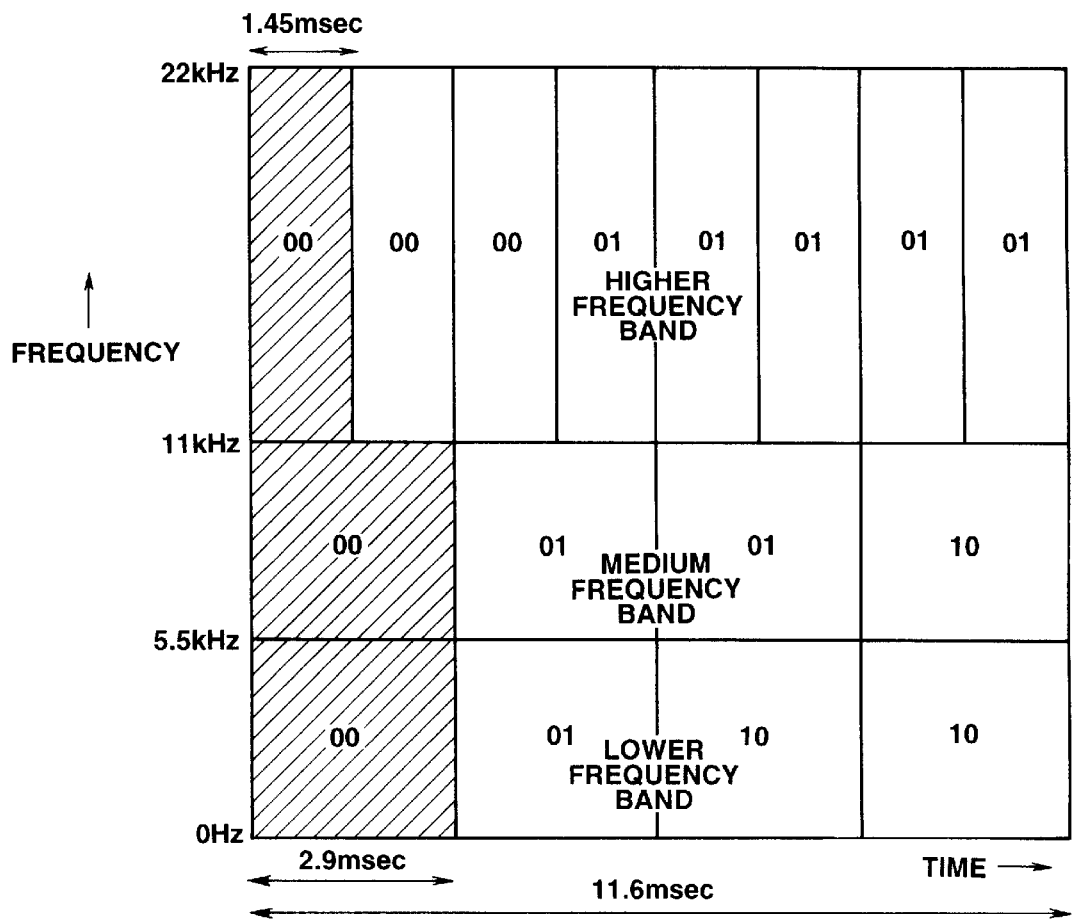
FIG. 6 is a view for explaining an example of frame of the embodiment.

Here, although not shown, outputs of respective bands from the band division filters 12, 13 are sent to orthogonal transform block size determining means, at which block sizes are determined every respective bands. This block size information is delivered to the respective MDCT circuits 14, 15, 16, at which filter outputs of the respective bands are caused to undergo blocking dependent upon these block sizes, and are subjected to orthogonal transform processing. With respect to length of this block size, as shown in FIG. 6, 11.6 ms is a fundamental length, and this length becomes the maximum block size. This maximum block size is referred to as "transform frame," or is simply referred to as "frame." For example, in the lower frequency band (0~5.5 kHz) and the medium frequency band (5.5. k~11 kHz), block size of either 11.6 ms (long mode) or 2.9 ms (short mode) can be selected. In the higher frequency band, block size of either 11.6 ms (long mode) or 1.45 ms (short mode) can be selected.

Spectrum data (also referred to as coefficient data) on the frequency base obtained after having undergone MDCT processing at respective MDCT circuits 14, 15, 16 are respectively temporarily stored into spectrum data buffers 43, 44, 45, and are then sent to an adaptive bit allocation encoding circuit 17, and to a control circuit 30 every units set taking critical bands into consideration as discussed above. The control circuit 30 determines, from inputted spectrum data, every unit, normalization coefficient (e.g., maximum value of absolute values of spectrum components (hereinafter referred to as spectrum signals) included in respective units, and the number of quantization steps (the number of quantization steps corresponding to the number of bits where-quantizing noise is sufficiently masked by a signal of corresponding critical band). It is to be noted that critical bands are frequency bands divided in consideration of the auditory sense characteristic of the human being, and are defined as bands that narrow band noises having the same intensity in the vicinity of a frequency of a certain pure sound have when that pure sound is masked by those noises. These critical bands are such that, as frequency shifts to higher frequency band side, bandwidths become broader, and the entire frequency band of 0~22 kHz is divided into, e.g., 25 critical bands. The control circuit 30 delivers the normalization coefficient and the number of quantization steps thus determined to the adaptive bit allocation encoding circuit 17, and also delivers the normalization coefficient and the number of quantization steps to a code train generating circuit 19 as encoding control information.

The adaptive bit allocation encoding circuit 17 carries out, every respective units, an operation to normalize the inputted spectrum data in response to the normalization coefficients delivered from the control circuit 30, and to quantize the resultant normalized spectrum data by the numbers of quantization steps delivered from the control circuit 30.

Data normalized and quantized in this way are delivered to a quantized data encoding circuit 18, at which further encoding (such as entropy encoding, etc.) is implemented thereto by using code tables. The data thus encoded is outputted to the code train generating circuit 19. The code train generating circuit 19 multiplexes encoded data outputted from the quantized data encoding circuit 18, and normalization coefficient, the number of quantization bits, code table ID (identification) information and code table sub information, etc. which correspond to the encoded data to generate a code train in conformity with a predetermined format. The code train generation circuit 19 outputs the code train thus generated. An ECC encoder 46 adds an error correction code to the code train output from the code train generating circuit 19. An output from the ECC encoder 46 is modulated by an EFM circuit 47. The data thus modulated is then delivered to a recording head 48. The recording head 48 records data outputted from the EFM circuit 47 onto a disc 49.

In the example shown in FIG. 3, the quantized data encoding circuit 18 is composed of, e.g., a selector (changeover) switch 31, and three encoders 32, 33, 34 of which code tables are different from each other. The selector switch 31 is subjected to selective switching in accordance with code table ID information or code table sub-information provided from the control circuit 30. As code tables used at respective encoders 32, 33, 34, code tables CT0, CT1, CT2 of the above-mentioned Table 1 are used. It is to be noted that the code table CT0 may be caused to be such a table to output inputted quantized data as it is, i.e., the encoder 32 may be a circuit which, in practice, does not encode using code table at all.

Figure 4:
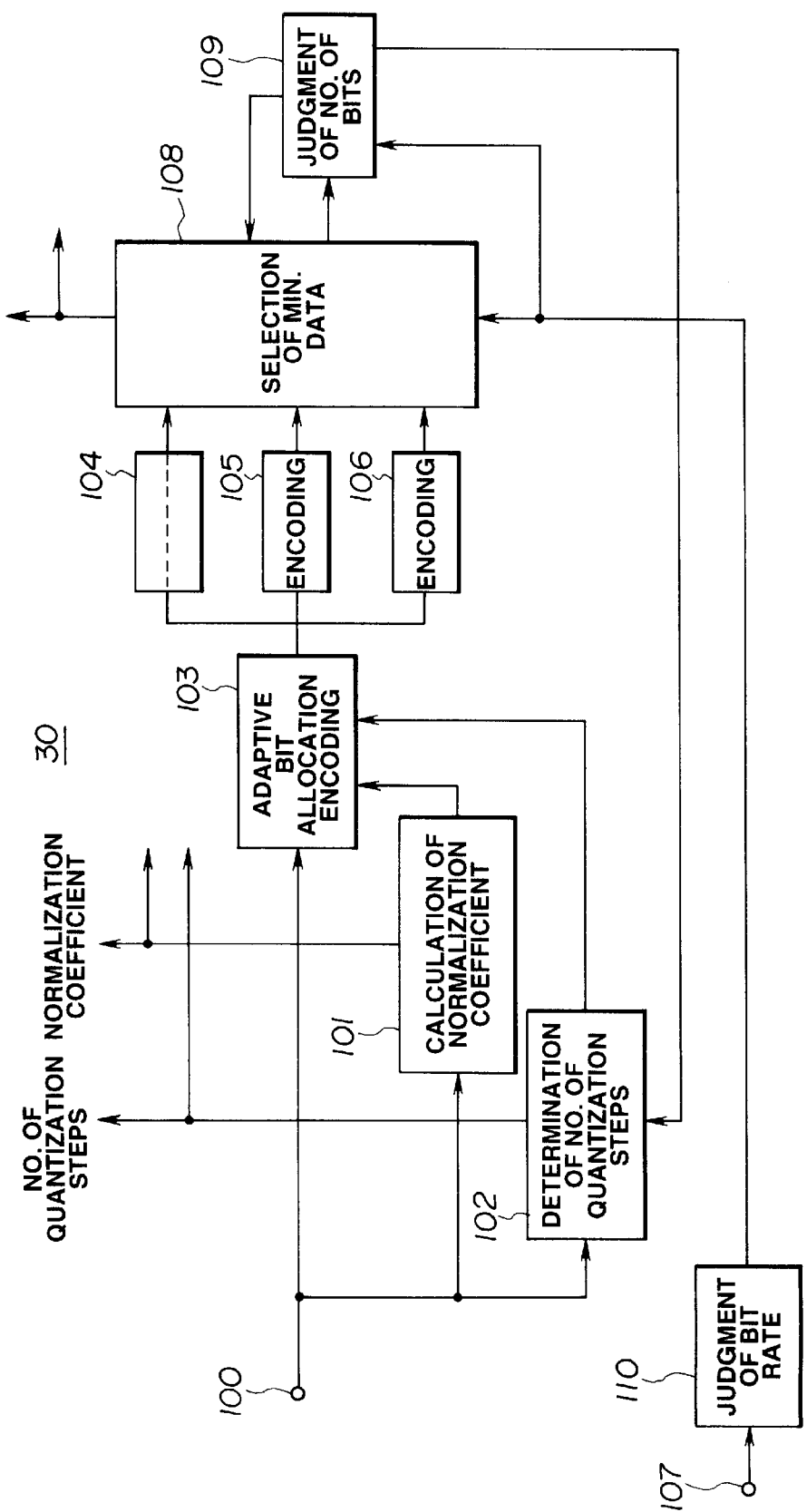
FIG. 4 is a block diagram showing an example of the circuit configuration of the control circuit of FIG. 3.

A more detailed configuration of the control circuit 30 is shown in FIG. 4. The control circuit 30 is adapted to carry out virtual encoding to set various parameters in generating code trains actually subjected to transmission or recording.

Spectrum data after having undergone MDCT are delivered from an input terminal 100 to a normalization coefficient determining circuit 101 and a number of quantization steps calculating circuit 102. The normalization coefficient calculating circuit 101 calculates normalization coefficients every respective units on the basis of inputted spectrum data to output normalization coefficient data to an adaptive bit allocation encoding circuit 103 and to the adaptive bit allocation encoding circuit 17 and the code train generating circuit 19 of FIG. 3. Moreover, the number of quantization steps determining circuit 102 determines the numbers of quantization steps every respective units on the basis of the inputted spectrum data. The adaptive bit allocation encoding circuit 103 normalizes and quantizes, every respective units, inputted spectrum data on the basis of the normalization coefficients and the numbers of quantization steps which have been determined. The normalized and quantized data are respectively delivered to encoders 104, 105, 106 corresponding to the encoders 32, 33, 34 of FIG. 3, at which they are encoded by using code tables different from each other.

A bit rate judging circuit 110 compares information of transfer bit rate inputted from a terminal 107 and a threshold value p, whereby when the transfer bit rate is the threshold value p or more, the bit rate judging circuit 110 sends an instruction to a minimum data selecting circuit 108 so as to select minimum data in which the number of bits is minimum every frame, while when the transfer bit rate is smaller than the threshold value p, the bit rate judging circuit 110 sends an instruction to the minimum data selecting circuit 108 so as to select minimum data in which the number of bits is minimum every unit. The minimum data selecting circuit 108 selects data in which the number of bits is minimum every frame or every unit from encoded data delivered from the encoders 104, 105, 106 to output the selected data to a number of bits judging circuit 109.

The number of bits judging circuit 109 judges whether or not the number of bits of the minimum data selected every frame or every unit is within such a value n to satisfy a predetermined bit rate. In the case where the number of bits is greater than n, the number of bits judging circuit 109 instructs the number of quantization steps determining circuit 102 to reset the number of quantization steps. In the case where the number of bits of the minimum data is greater than n, the adaptive bit allocation encoding circuit 103, the encoders 104, 105, 106, the minimum data selecting circuit 108 and the number of bits judging circuit 109 repeat the above-mentioned processing until the number of bits of the minimum data is caused to fall within n. In the case where the number of bits judging circuit 109 judges that the number of bits of the minimum data is caused to fall within n, it instructs the number of quantization steps determining circuit 102 to output the number of quantization steps at that time to the adaptive bit allocation circuit 17 and the code train generating circuit 19 of FIG. 3. In addition, the number of bits judging circuit 109 instructs the minimum data selecting circuit 108 to output code table information corresponding to data selected at that time to the selector switch 31 and the code train generating circuit 19 of FIG. 3.

The adaptive bit allocation encoding circuit 17 of FIG. 3 carries out the above-described normalization and quantization on the basis of the normalization coefficient and the number of quantization steps obtained in this way. Moreover, the quantized data encoding circuit 18 selects, every frame or every unit, a corresponding code table on the basis of code table information selected in this way to carry out encoding.

Figure 5:
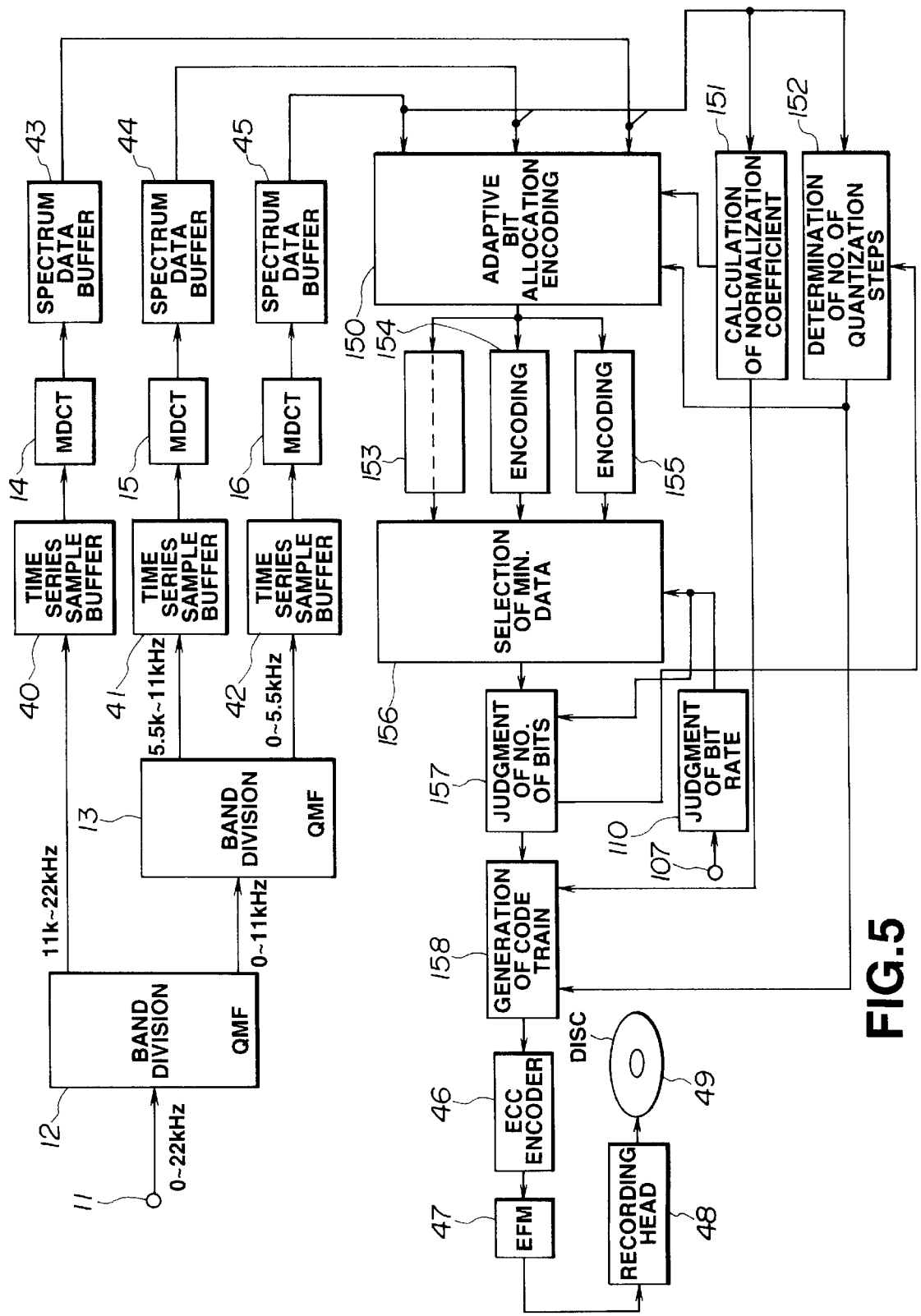
FIG. 5 is a functional block diagram showing another example of the configuration for realizing, in a more practical manner, the signal encoding method of the embodiment.

FIG. 5 shows another embodiment of an efficient encoding apparatus. The same reference numerals are respectively attached to the same components as those of FIG. 4, and its detailed explanation is omitted. Spectrum data after having undergone MDCT delivered from spectrum data buffers 43, 44, 45 are delivered to a normalization coefficient calculating circuit 151 and a number of quantization steps determining circuit 152. The normalization coefficient calculating circuit 151 calculates a normalization coefficient every unit on the basis of inputted spectrum data, and outputs the calculated normalization coefficient to an adaptive bit allocation encoding circuit 150 and a code train generating circuit 158. Moreover, the number of quantization steps determining circuit 152 determines the number of quantization steps, every unit, on the basis of the input spectrum data to output the number of quantization steps to the adaptive bit allocation encoding circuit 150 and the code train generating circuit 158. The adaptive bit allocation encoding circuit 150 normalizes and quantizes, every unit, spectrum data delivered from spectrum data buffers 43, 44, 45 on the basis of the normalization coefficient and the number of quantization steps which have been determined. The normalized, quantized data are delivered to respective encoders 153, 154, 155, at which they are encoded by using code tables different from each other.

Bit rate judging circuit 110 compares information of transfer bit rate inputted from terminal 107 and threshold value p. When the transfer bit rate is p or more, the bit rate judging circuit 110 gives an instruction to a minimum data selecting circuit 156 to select minimum data in which the number of bits is minimum every frame. When the transfer bit rate is smaller than p, the bit rate judging circuit 110 gives an instruction to the minimum data selecting circuit 156 to select minimum data in which the number of bits is minimum every unit. The minimum data selecting circuit 156 selects data in which the number of bits is minimum every frame or every unit from encoded data delivered from encoders 153, 154, 155. The selected data (whether minimum every frame or every unit) is to a number of bits judging circuit 157. In addition, the minimum data selecting circuit 156 outputs code table information corresponding to the selected minimum data to the code train generating circuit 158.

The number of bits judging circuit 157 judges whether or not the number of bits of minimum data selected every frame or every unit is within such a value n to satisfy a predetermined rate. If the number of bits is greater than n, the number of bits judging circuit 157 instructs the number of quantization steps determining circuit 152 to reset the number of quantization steps. If the number of bits of the minimum data is greater than n, the adaptive bit allocation encoding circuit 150, the encoders 153, 154, 155, the minimum data selecting circuit 156, and the number of bits judging circuit 157 repeat the above-mentioned processing until the number of bits of the minimum data is caused to fall within n. If the number of bits judging circuit 157 judges that the number of bits of the minimum data is within n, it outputs its minimum data to the code train generating circuit 158. The code train generating circuit 158 multiplexes encoded data outputted from the number of bits judging circuit 157, and normalization coefficient, the number of quantization bits, code table ID information and code table sub information, etc. which correspond to the encoded data to generate a code train in conformity with a predetermined format. The code train generating circuit 158 then outputs the code train.

Meanwhile, if only one code table is selected with respect to a certain frame, only a flag indicating corresponding code table (code table ID information) exists as information according to the code table at the portion corresponding to one frame in a code train outputted from the code train generating circuit 19 of FIG. 3 (or the code train generating circuit 158 of FIG. 5). On the other hand, if code tables are selected with respect to the respective units, both a flag indicating that tables are selected every respective units (code table ID information) and an indication of the tables actually selected at respective units (code table sub-information) are included.

FIG. 6 is a view showing an example of the application relationship between the above-described transform frame and selected code table. In the case of this example, the code table is divided by block size of MDCT in the time base direction, and switching is carried out every blocks divided every output bands of band division filters 12, 13 in the frequency base direction. Accordingly, as code table ID information of this frame, "11" is selected. In the example of FIG. 5, in all of the lower frequency band, the medium frequency band and the higher frequency band, the above-described short mode is selected as block size of MDCT. Accordingly, respective blocks in the lower frequency band, the medium frequency band, and the higher frequency band become blocks indicated by slanting line portions in FIG. 5. Moreover, flags "00", "01" and "10" in the figure are examples of flags of code table sub information indicating code tables selected every respective blocks. In the lower frequency band, e.g., "00", "01", "10", and "10" are respectively assigned (allocated) to four blocks within one transform frame. In the medium frequency band, e.g., "00", "01", "01", and "10" are respectively assigned (allocated) to four blocks within one transform frame. In the higher frequency band, e.g., "00", "00", "00", "01", "01", "01" and "01" are respectively assigned (allocated) to eight blocks within one transform frame.

As stated above, in accordance with this embodiment, it is possible to select optimum code tables with respect to respective blocks. In this case, normalization and quantization are carried out every units obtained by further sub-dividing respective blocks in the frequency base direction. Selection of code table may be carried out every unit as described above.

Figure 7:
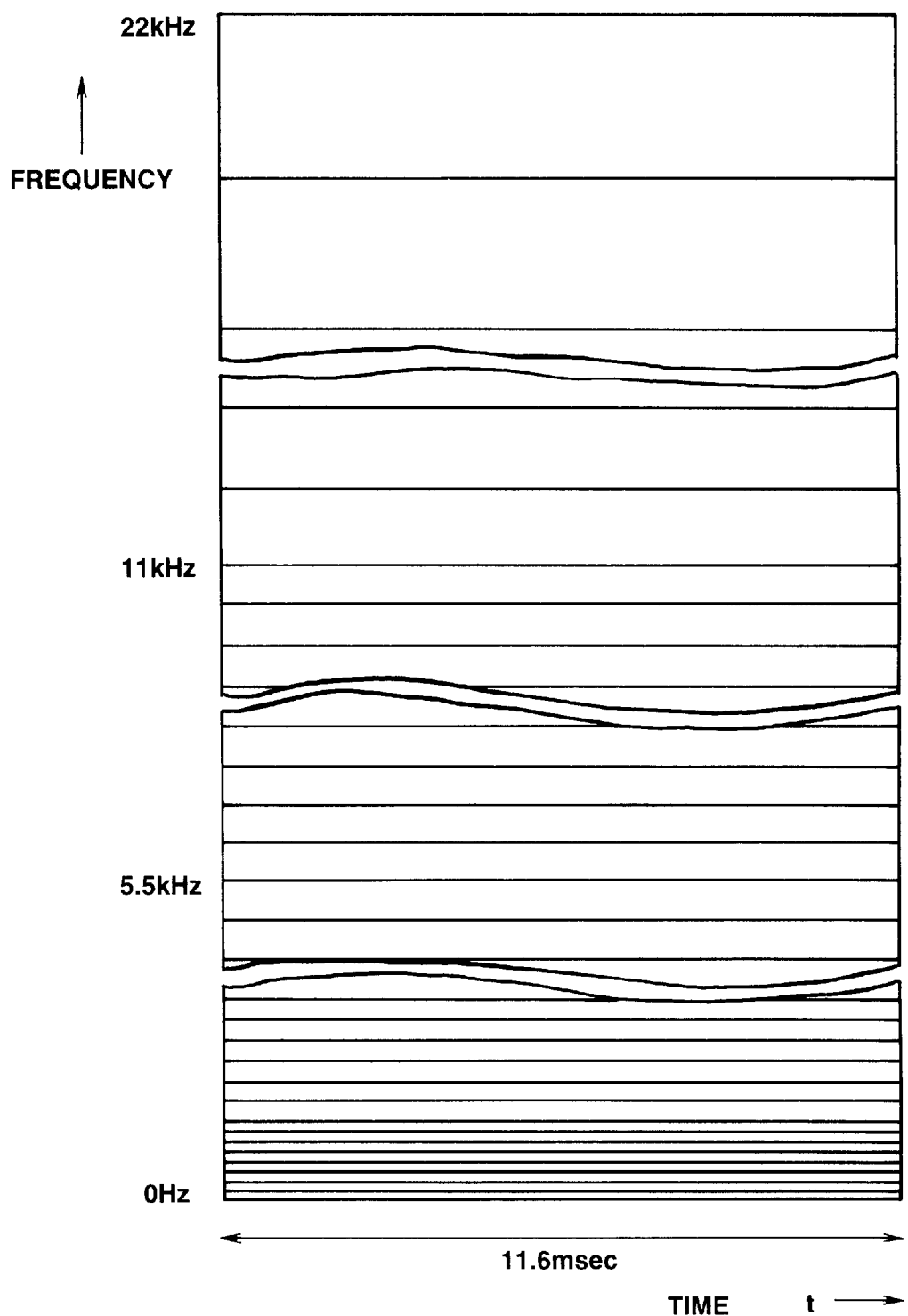
FIG. 7 is a view for explaining another example of frame of the embodiment.

Moreover, FIG. 7 shows another embodiment of the transform frame. In the case of this example, the orthogonal transform block size is fixed to 11.6 ms with respect to all bands. Namely, switching between long mode and short mode in the time base direction is not carried out. By allowing the block size of the orthogonal transform processing to be fixed in this way, it becomes possible to simplify the configuration of the MDCT circuit and the IMDCT circuit. Further, in the case of the example of FIG. 7, the transform frame is divided into 52 bands in the frequency base direction, and the transform frame is ultimately constituted by 52 units. Normalization and quantization are carried out every respective units. In addition, it is possible to select a code table every unit. Accordingly, in the case where encoding is carried out by using one code table with respect to the entirety of one frame, any one of "00", "01" and "10" is subjected to transmission or recording every frame as code table ID information. In the case where code table is selected every unit to carry out encoding, "11" is subjected to transmission or recording as code table ID information, and any one of "00", "01" and "10" is subjected to transmission or recording as code table sub information every unit.

It is to be noted that while the basic unit in the time base direction, i.e., the maximum block size of the orthogonal transform processing is set to 11.6 ms in FIG. 7, such maximum block size may be fixed to 23.2 ms with respect to all bands. Moreover, while, in the above-described embodiment, the number of divisions in the frequency base direction is set to 52 so that division into respective units is made, the number of divisions may be set to 32 so that division into respective units is made. In addition, while the band of inputted data is set to 0 Hz to 22 kHz, that band may be set to 0 Hz to 22.05 kHz.

Figure 8:
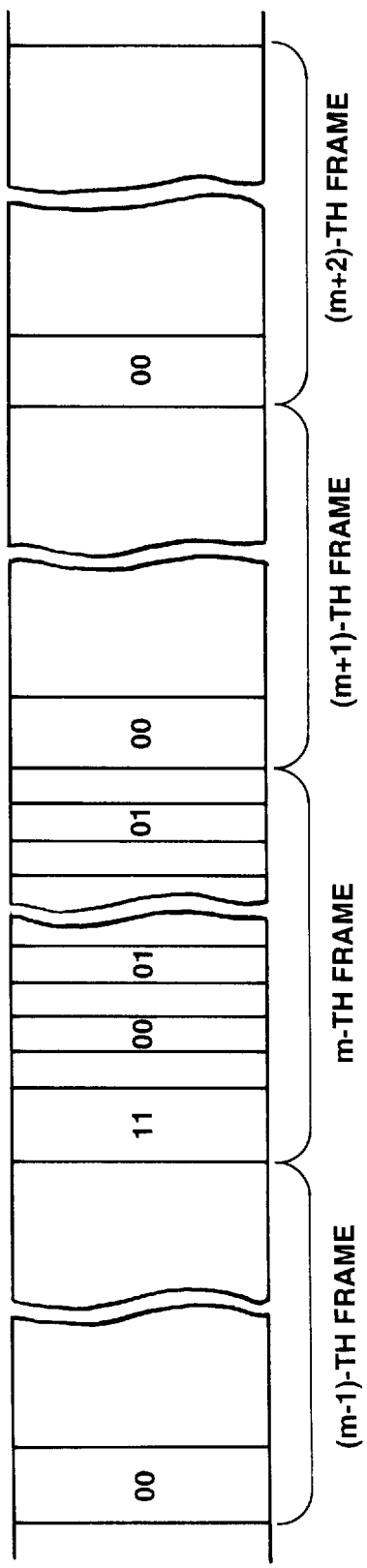
FIG. 8 is a view for explaining a code train subjected to transmission or recording.

FIG. 8 is a view showing outline of the configuration of an example of a code train generated at the code train generating circuit 19 (FIG. 3) or the code train generating circuit 158 (FIG. 5). While information such as spectrum data, normalization coefficients and the numbers of quantization steps, etc. which have been subjected to normalization, quantization and encoding are included in an actual code train, only information relating to the code table is indicated in FIG. 8 for the brevity. In this figure, the (m−1)-th frame, the (m+1)-th frame and the (m+2)-th frame are encoded respectively by using single code table CT0. Accordingly, in the code train, flags "00" are transmitted one by one per one frame as the code table ID signal. On the other hand, with respect to the m-th frame, code tables are selected every units so that the m-th frame is encoded. Accordingly, flag "11" indicating such application of code table is transmitted as the code table ID signal. Further, "00", "01" . . . "01" indicating code tables selected every units are transmitted as code table sub information every units.

It is to be noted that encoding such as entropy encoding, etc. of the spectrum signals (spectrum data) may be carried out every respective bands, or may be implemented to a portion of the spectrum signals. Moreover, in this operation, spectrum signals of respective blocks may be divided into several units thus to normalize spectrum signals every respective units. By employing such an approach, operation of higher accuracy can be performed with the same resulting operation word length. Further, such division of bands or units may be changeably carried out in dependency upon the property of an input signal.

Moreover, with respect to the encoding of quantized data, not only may entropy encoding to assign (allocate) codes of short word length to signals of higher occurrence frequency be carried out and to assign (allocate) codes of long word length to signals of lower occurrence frequency, but also encoding using completely different peculiar code table may be carried out.

Figure 9:
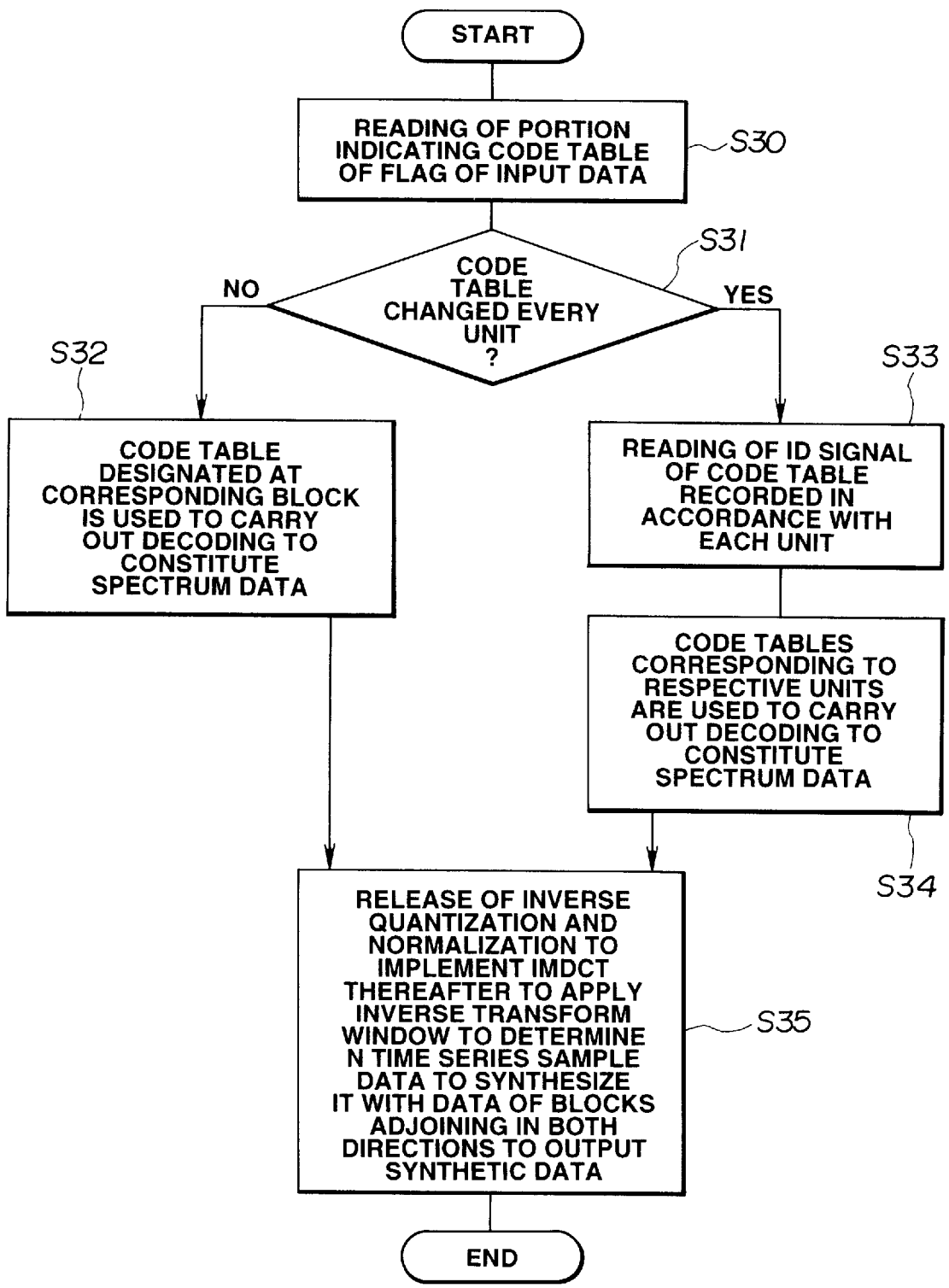
FIG. 9 is a flowchart showing outline of the operation of the fundamental embodiment of a signal decoding method according to this invention.

FIG. 9 is a flowchart showing an outline of the signal decoding procedure for carrying out decoding of signals obtained by the above-described encoding method or efficient encoding apparatus of the embodiment. Steps S30 to S35 of FIG. 9 respectively represent steps of the operation.

At step S30 a flag of the portion indicating code table of data inputted directly from the efficient encoding apparatus or through a transmission path therefrom, or reproduced and inputted from recording media such as package media, etc. is read.

At the step S31, judgment is made as to whether or not this flag read indicates that the code table is changed (switched) every unit and that the ID signal of code table of each unit is independently subjected to recording or transmission. In the case where this flag indicates that code table is changed every unit, the processing operation proceeds to step S33. In contrast, in the case where this flag indicates that the entirety of block is encoded by one code table, the processing operation proceeds to step S32.

At step S32, code table designated by using flag is used to carry out decoding to constitute N/2 (number of) spectrum data. Thus, the processing procedure proceeds to step S35.

At step S33, ID signal of code table independently subjected to recording or transmission in accordance with each unit is read. Thus, the processing operation proceeds to step S34.

At step S34, code tables corresponding to the ID signal which have been read at the step S33 are used to decode spectrum data of respective units to constitute N/2 (number of) spectrum data in total. Thus, the processing operation proceeds to step S35.

At step S35, release of inverse quantization and normalization is carried out with respect to decoded spectrum data thereafter to implement IMDCT to apply an inverse transform window to determine N (number of) time series sample data to synthesize it with data of blocks adjoining in both directions to output synthetic output. Thus, the processing is completed.

A decoding apparatus for realizing the above-described decoding processing, (i.e., an efficient decoding apparatus for carrying out processing opposite to that of the efficient encoding) will now be described with reference to FIG. 10.

Figure 10:
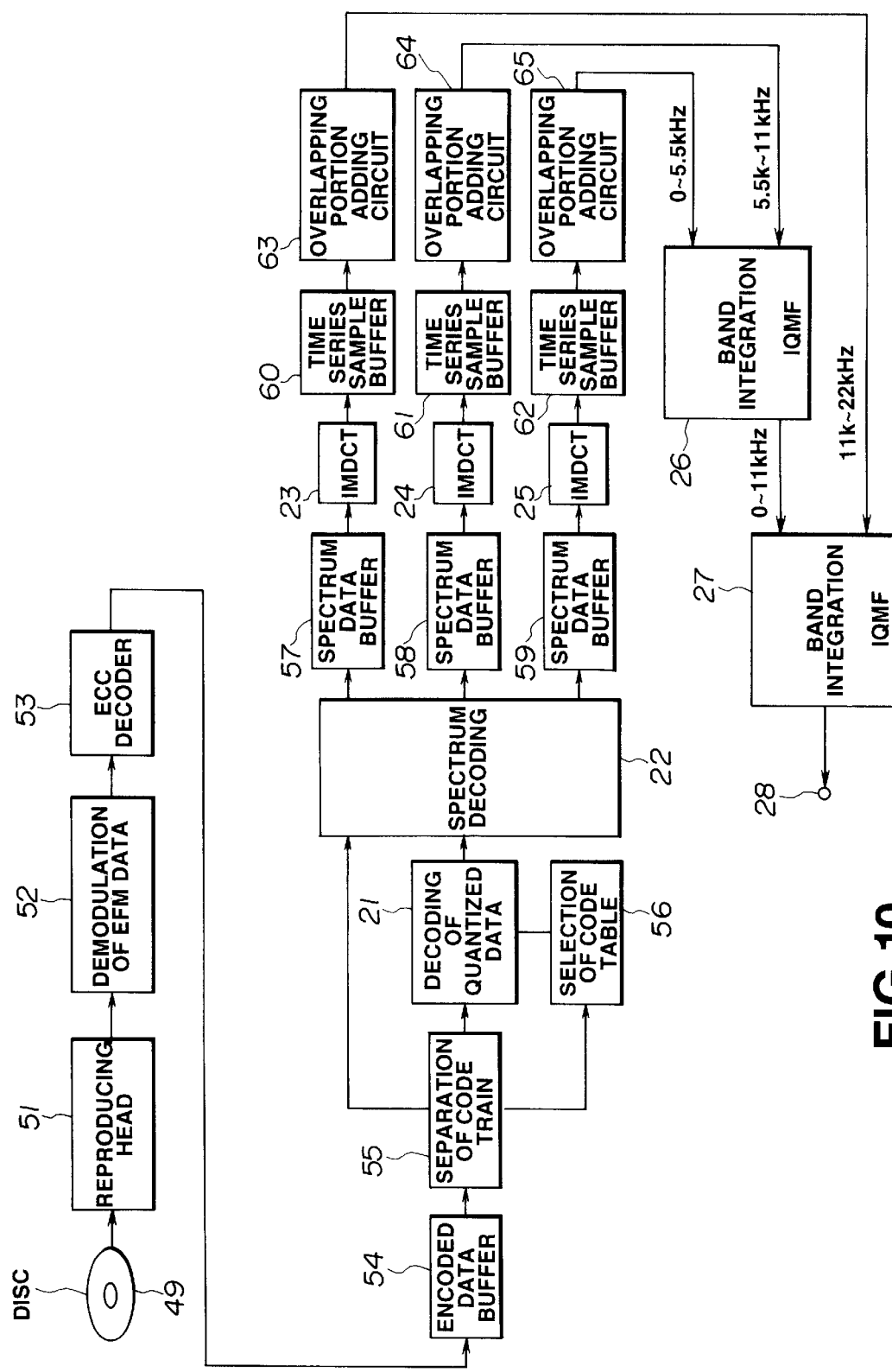
FIG. 10 is a block diagram showing an example of the circuit configuration of an efficient decoding apparatus which realizes the signal decoding method of the embodiment.

In FIG. 10 a code train reproduced through a reproducing head 51 from disc 49 is delivered to an EFM data demodulating circuit 52. The EFM data demodulating circuit 52 demodulates the inputted code train. The demodulated code train is delivered to an ECC decoder 53, at which error correction is carried out. The error corrected code train is temporarily stored into an encoded data buffer 54, and is then delivered to a code train separating circuit 55. The code train separating circuit 55 releases multiplexing of the code train to deliver normalization coefficient and the number of quantization steps to a spectrum decoding circuit 22; delivers an encoded spectrum signal which has been normalized and quantized, and encoded by using code table to a quantized data decoding circuit 21, and delivers information relating to code table (code table ID information and code table sub information) to a code table selecting circuit 56. The code table selecting circuit 56 decodes the code table ID information to judge whether that information is a flag indicating a code table used in encoding of the entirety of one frame (i.e., "00", "01", "10"), or a flag indicating that code table sub information exists (i.e., "11").

In the case where the code table ID information is a flag indicating a code table used in encoding of the entirety of one frame, the code table selecting circuit 56 instructs the quantized data decoding circuit 21 to carry out decoding by using the code table designated by the flag with respect to all units within the corresponding one frame. Moreover, in the case where code table ID information is flag indicating that code table sub information exists, the code table selecting circuit 56 decodes the code table sub information transmitted every unit to instruct the quantized data decoding circuit 21 to carry out decoding by using code table designated by the flag of code table sub information every unit.

Figure 11:
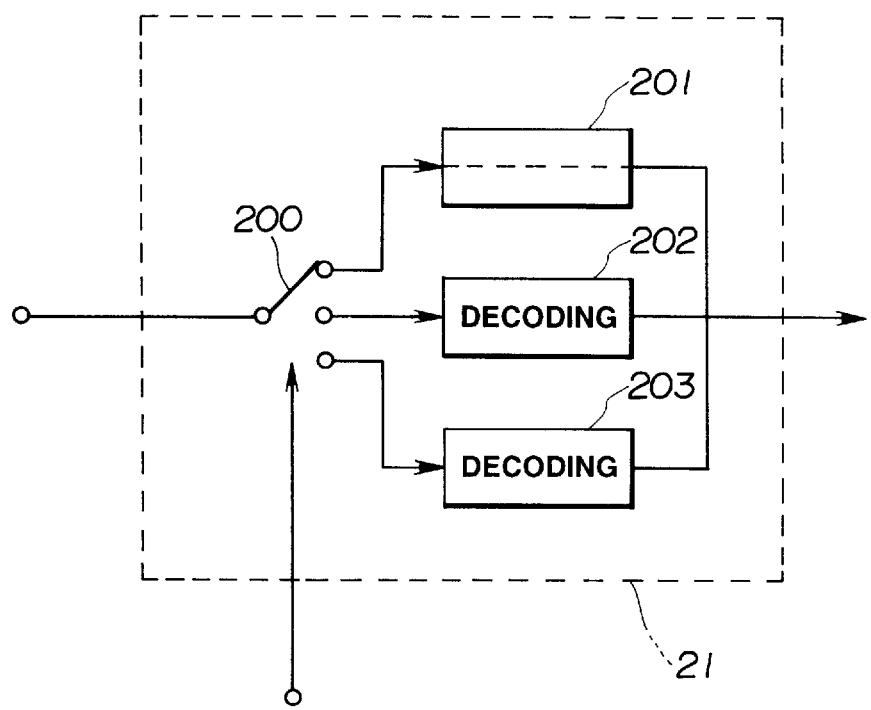
FIG. 11 is a block diagram showing an example of the circuit configuration of the quantized data decoding circuit of FIG. 10.

The quantized data decoding circuit 21 is composed, as shown in FIG. 11, for example, of a selector (changeover) switch 200 and three decoders 201, 202, 203 of which code tables are different from each other. In this example, these three decoders 201, 202, 203 respectively carry out processing opposite to those of encoders 32, 33, 34 (or encoders 153, 154, 155) of the efficient encoding apparatus. At the quantized data decoding circuit 21, the selector switch 200 is switched every frame, or every unit on the basis of a select signal delivered from the code table selecting circuit 56. Thus, decoding is carried out by using a code table corresponding to code table used at the time of encoding.

The spectrum decoding circuit 22 carries out release of inverse quantization and normalization by using the normalization coefficient and the number of quantization steps delivered from the code train separating circuit 55 every unit with respect to the data delivered from the quantized data decoding circuit 21 to construct spectrum data. Data corresponding to the band of 11 k~22 kHz of these spectrum data are temporarily stored into a spectrum data buffer 57, and are then sent to an IMDCT circuit 23 by N/2 number of data. Moreover, data corresponding to the band of 5.5 k–11 kHz are temporarily stored into a spectrum buffer 58, and are then sent to an IMDCT circuit 24 by N/2 number of data. Further, data corresponding to the band of 0–5.5 kHz are temporarily stored into a spectrum data buffer 59, and are then sent to an IMDCT circuit 25 by N/2 number of data.

The IMDCT circuits 23, 24, 25 respectively implement IMDCT to spectrum data to apply an inverse transform window to generate N (number of) time series sample data. The time series sample data outputted from the IMDCT circuits 23, 24, 25 are respectively temporarily stored into time series sample buffers 60, 61, 62, and are then delivered to overlapping portion adding circuits 63, 64, 65. The overlapping portion adding circuits 63, 64, 65 respectively carry out processing to add time series sample data stored in the time series sample buffers 60, 61, 62 to time series sample data of blocks adjoining in both directions to output signal waveform data every respective bands.

The signal waveform data of 0~5.5 kHz and the signal waveform data of 5.5. k~11 kHz of the signal waveform data in these three bands obtained in this way are first synthesized by a band integration (synthesis) circuit 26, i.e., both signal waveform data are changed into signal waveform data of 0~11 kHz. The synthetic signal thus obtained is synthesized with the signal waveform data of 11 k~22 kHz by a band integration (synthesis) circuit 27. Thus, signal waveform data over the entire band is outputted from output terminal 28.

It is to be noted while, in the above-described embodiments, a plurality of encoders 32, 33, 34 or encoders 104, 105, 106 for carrying out encoding by using code tables different from each other are respectively provided on the encoder (efficient encoding apparatus) side to adoptively select code table thus to carry out encoding, only one encoder may be provided in advance to encode the entire frame by using a single code table. When such an approach is employed, the circuit scale of the encoder can become more compact. It should be noted that, also in this case, since it is necessary to inform the decoder (efficient decoding apparatus) side of a code table used for encoding, the code table ID signal is subjected to transmission or recording similarly to the above-described embodiment.

Moreover, while, in the above-described embodiments, an approach is employed to select a code table of the highest encoding efficiency, by the minimum data selecting circuit 108 or the minimum data selecting circuit 156, a user may also arbitrarily set the code table.

Further, while in the above-described embodiments, encoders 32, 33, 34, encoders 104, 105, 106 and decoders 201, 202, 203 are constituted by independent (separate) hardware, there may be employed a configuration in which at least one of encoders or decoders are caused to be commonly used to read out respective code tables stored in ROM, etc. to use them.

Further, while, in the above-described embodiments, at the preceding stage of MDCT, the entire band is divided into three bands of uneven bandwidths by using two QMFs (Quadrature Mirror Filters), the entire band may be divided into four bands of equal bandwidth by using PQF (Polyphase Quadrature Filter), etc. to carry out MDCT with respect to respective bands.

Further, while judgment of the number of bits is carried out by using encoded data itself in the above-described embodiments, such a judgment may be carried out by operation.

Further, while code trains are recorded onto the disc in the above-described embodiments, optical disc, magneto-optical disc and phase change disc, etc. may be used as the disc. Moreover, as a recording medium, in addition to the above, magnetic disc, tape shaped recording medium, or IC card, etc. using semiconductor, memory element, etc. may be employed. Moreover, this invention is not limited to the case where code trains are recorded onto or into the recording medium, and such code trains may be instead transmitted through a transmission path such as an optical fiber, etc.

Further, this invention is not limited only to the above-described embodiments. Apparatuses applied are not limited to efficient encoding apparatus/efficient decoding apparatus shown in the FIGS. 3, 5, 10 mentioned above, but may be also applied to various transform encoding apparatuses or decoding apparatuses for releasing encoding. Moreover, this invention can be applied not necessarily only to the case where spectrum transform processing is used, but also to the case where band division is made by a band division filter to carry out encoding/decoding.

Further, this invention may be applied not only to, e.g. a signal processor for audio PCM signals, but also to signal processors for digital speech signal or digital video signal, etc. Furthermore, as the bit allocation technique, a wide variety of bit allocation techniques are conceivable. As the most simple method, fixed bit allocation, simple bit allocation by respective band energies of signals, and bit allocation in which fixed bit allocation and variable bit allocation are combined may be used. In addition, as described above, the above-mentioned orthogonal transform block size is not limited to the example shown, but may be caused to arbitrarily undergo a setting such that, e.g., the orthogonal transform block size is set to 23.2 ms in the time base direction, the number of division of bands in the frequency base direction is set to 4, or the orthogonal transform block size is set to 22.05 kHz or 20 kHz in the frequency base direction.

In accordance with the signal encoding method or apparatus according to this invention, an input signal is divided into blocks to divide these blocks into a plurality of units to implement compression encoding thereto to encode a portion or all of the processed signals by using code table or tables to take out an output signal, wherein respective blocks are permitted to have a plurality of code tables for encoding, thus making it possible to designate a code table for encoding at least every frame. Thus, in the case where there is a need for the hardware scale of the encoder to be compact an approach is employed to constitute a signal encoding apparatus in which only one code table is provided, to use that one code table in encoding. Moreover, in the case where there is a need to allow the encoding efficiency to be higher, there is employed a configuration in which a plurality of code tables are provided, thus making it possible to select a code table which can carry out encoding with the highest efficiency every frame, every block, every unit or every number of quantization steps.

Accordingly, this invention can cope with, by control of flag in the same standard, both the case where there is a need to carry out more efficient encoding and the case where there is a need to provide a more simple hardware.

What is claimed is:

1. An apparatus for encoding data, comprising:
adaptive bit allocation encoding circuitry that normalizes frames of input spectrum data into transform frames in accordance with normalization coefficients and number of quantization step information;
quantized data encoding circuitry that encodes each transform frame of normalized spectrum data with at least one selected code table of a plurality of code tables in accordance with a code table selection signal;

code train generation circuitry that generates a code train that includes the encoded normalized spectrum data and information indicative of the at least one selected code table and of the normalization coefficients and number of quantization step information in accordance with which the encoding circuitry normalizes each frame of input spectrum data; and control circuitry that generates the code table selection signal, the number of quantization step information, and the normalization coefficients in response to the input spectrum data.

2. The apparatus of claim 1, wherein the adaptive bit allocation encoding means is first adaptive bit allocation encoding means, and wherein the control circuitry includes:

means for calculating the normalization coefficients from the frame of input spectrum data; and means for determining a combination of number of quantization steps and one of the plurality of code tables with which encoding the transform frame generated in accordance with the calculated normalization coefficients is such to satisfy a desired bit rate.

3. The apparatus of claim 1, wherein the adaptive bit allocation encoding means is first adaptive bit allocation encoding means, and wherein the combination determining means includes:

number of quantization step setting means for setting the number of quantization steps;

second adaptive bit allocation encoding means for adaptively allocating bits of the input spectrum data in response to the determined normalization coefficients and the set number of quantization steps;

a plurality of encoders, each encoder encoding the bits of the input spectrum data, adaptively allocated, using a separate code table to generate a separate stream of encoded spectrum data;

minimum data selecting circuitry that determines which of the separate streams of encoded spectrum data has a minimum number of bits, wherein the selected code table indicated by the code train generation circuitry corresponds to the determined separate stream;

number of bit judging circuitry that determines whether the minimum number of bits is such to satisfy a desired bit rate and, if the minimum number of bits is not such to satisfy a desired bit rate, causes the number of quantization steps setting means to reset the number of quantization steps.

4. The apparatus of claim 1, wherein when the quantized data encoding circuitry encodes a particular frame of normalized spectrum data with more than one selected code table, the code train generation circuitry includes in the code train, for the frame, a flag indicative thereof.

5. The apparatus of claim 1, wherein the normalized spectrum data includes frames, and wherein each frame of normalized spectrum data includes a plurality of compression units, when the quantized data encoding circuitry encodes a particular frame of normalized spectrum data with more than one selected code table, the quantized data encoding circuitry separately encodes each compression unit with one of said at least one selected code tables.

6. A method for encoding data, comprising the steps of:

adaptively allocating bits to normalize frames of input spectrum data into transform frames in accordance with normalization coefficients and number of quantization step information;

encoding each transform frame of normalized spectrum data with at least one selected code table of a plurality of code tables in accordance with a code table selection signal;

generating a code train that includes the encoded normalized spectrum data and information indicative of the at least one selected code table and of the normalization coefficients and number of quantization step information in accordance with which the each frame of input spectrum data is normalized;

generating the code table selection signal, the number of quantization step information, and the normalization coefficients in response to the input spectrum data.

7. The encoding method of claim 6, wherein the step of adaptively allocating bits is a first step of adaptively allocating bits, and wherein the control step includes:

calculating the normalization coefficients from the frame of input spectrum data; and determining a combination of number of quantization steps and one of the plurality of code tables with which encoding the transform frame generated in accordance with the calculated normalization coefficients is such to satisfy a desired bit rate.

8. The encoding method of claim 6, wherein the step of adaptively allocating bits is a first step of adaptively allocating bits, and wherein the combination determining step includes:

setting the number of quantization steps;

a second step of adaptively allocating bits, for allocating bits of the input spectrum data in response to the set normalization coefficients and the set number of quantization steps;

encoding the bits of the input spectrum data with separate ones of a plurality of encoders, adaptively allocated by the second set of adaptively allocating bits, each encoder using a separate code table to generate a separate stream of encoded spectrum data;

determining which of the separate streams of encoded spectrum data has a minimum number of bits, wherein the selected code table corresponds to the determined separate stream;

determining whether the minimum number of bits is such to satisfy a desired bit rate and, if the minimum number of bits is not such to satisfy a desired bit rate, resetting the number of quantization steps in the second step of adaptively allocating bits.

9. The encoding method of claim 6, wherein when the quantized data encoding step encodes a particular frame of normalized spectrum data with more than one selected code table, the code train generation step includes in the code train, for the frame, a flag indicative thereof.

10. The encoding method of claim 6, wherein the normalized spectrum data includes frames, and wherein each frame of normalized spectrum data includes a plurality of compression units, when a particular frame of normalized spectrum data is encoded with more than one selected code table, each compression unit is separately encoded with one of said at least one selected code tables.

11. A signal recording medium having encoded signals recorded thereon, wherein the encoded signals recorded thereon are encoded by a method comprising:

adaptively allocating bits to normalize frames of input spectrum data into transform frames in accordance with normalization coefficients and number of quantization step information;

encoding each transform frame of normalized spectrum data with at least one selected code table of a plurality of code tables in accordance with a code table selection signal;

generating a code train that includes the encoded normalized spectrum data and information indicative of the at least one selected code table and of the normalization coefficients and number of quantization step information in accordance with which the each frame of input spectrum data is normalized;

generating the code table selection signal, the number of quantization step information, and the normalization coefficients in response to the input spectrum data.

12. The signal recording medium of claim 11, wherein the step of adaptively allocating bits is a first step of adaptively allocating bits, and wherein the control step includes:

calculating the normalization coefficients from the frame of input spectrum data; and determining a combination of number of quantization steps and one of the plurality of code tables with which encoding the transform frame generated in accordance with the calculated normalization coefficients is such to satisfy a desired bit rate.

13. The signal recording medium of claim 11, wherein the step of adaptively allocating bits is a first step of adaptively allocating bits, and wherein the combination determining step includes:

setting the number of quantization steps;

a second step of adaptively allocating bits, for allocating bits of the input spectrum data in response to the set normalization coefficients and the set number of quantization steps;

encoding the bits of the input spectrum data with separate ones of a plurality of encoders, adaptively allocated by the second set of adaptively allocating bits, each encoder using a separate code table to generate a separate stream of encoded spectrum data;

determining which of the separate streams of encoded spectrum data has a minimum number of bits, wherein the selected code table corresponds to the determined separate stream;

determining whether the minimum number of bits is such to satisfy a desired bit rate and, if the minimum number of bits is not such to satisfy a desired bit rate, resetting the number of quantization steps in the second step of adaptively allocating bits.

14. The signal recording medium of claim 13, wherein when the quantized data encoding step encodes a particular frame of normalized spectrum data with more than one selected code table, the code train generation step includes in the code train, for the frame, a flag indicative thereof.

15. The signal recording medium of claim 11, wherein the normalized spectrum data includes frames, and wherein each frame of normalized spectrum data includes a plurality of compression units, when a particular frame of normalized spectrum data is encoded with more than one selected code table, each compression unit is separately encoded with one of said at least one selected code tables.

16. A method for decoding encoded signal data, comprising:

selecting at least one code table as indicated by an identification signal in the encoded signal data;

decoding frames of the encoded signal data in accordance with the selected at least one code table;

expanding the decoded frames to generate spectrum signals; and inverse transforming the decoded signal to restore the signal data in an unencoded form, wherein the selecting step includes:

determining if the identification signal indicates that a particular frame has been encoded with more than one code table and, if the determination is affirmative, determining the more than one code table with which the particular frame has been encoded.

17. The method of claim 16, wherein the frames each include a plurality of compression steps, and wherein if the determination is affirmative, the decoding step decodes each compression step in accordance with a separate one of the determined more than one code table.

18. A decoding apparatus for decoding encoded signal data, comprising:

means for selecting at least one code table as indicated by an identification signal in the encoded signal data;

means for decoding frames of the encoded signal data in accordance with the selected at least one code table;

means for expanding the decoded frames to generate spectrum signals; and means for inverse transforming the decoded signal to restore the signal data in an unencoded form, wherein the selecting means includes:

determining means for determining if the identification signal indicates that a particular frame has been encoded with more than one code table and, if the determination is affirmative, determining the more than one code table with which the particular frame has been encoded.

19. The decoding apparatus of claim 18, wherein the frames each include a plurality of compression steps, and wherein if the determination is affirmative, the decoding step means is for decoding each compression step in accordance with a separate one of the determined more than one code table.

* * * * *